United States Patent [19]

Chase

[11] Patent Number: 5,036,380
[45] Date of Patent: Jul. 30, 1991

[54] BURN-IN PADS FOR TAB INTERCONNECTS

[75] Inventor: Richard A. Chase, Boylston, Mass.

[73] Assignee: Digital Equipment Corp., Maynard, Mass.

[21] Appl. No.: 518,335

[22] Filed: May 7, 1990

Related U.S. Application Data

[63] Continuation of Ser. No. 173,094, Mar. 28, 1988, abandoned.

[51] Int. Cl.$^5$ .................. G01R 31/02; H01L 39/02
[52] U.S. Cl. ................................ 357/70; 437/220
[58] Field of Search ................ 357/70, 68; 437/220

[56] References Cited

U.S. PATENT DOCUMENTS

| | | | |
|---|---|---|---|
| 4,195,195 | 3/1980 | De Miranda et al. | 357/68 |
| 4,220,917 | 9/1980 | McMahon, Jr. | 357/70 |
| 4,259,436 | 3/1981 | Tabuchi et al. | 357/70 |
| 4,386,389 | 5/1983 | Proebsting . | |
| 4,411,719 | 10/1983 | Lindberg | 357/70 |
| 4,466,183 | 8/1984 | Burns | 357/69 |
| 4,510,017 | 4/1985 | Barber | 357/70 |
| 4,701,363 | 10/1987 | Barber | 357/70 |
| 4,701,781 | 10/1987 | Sankhagowit | 357/70 |
| 4,756,080 | 7/1988 | Thorp, Jr. et al. | 29/827 |
| 4,772,936 | 9/1988 | Reding et al. | 357/70 |
| 4,801,999 | 1/1989 | Hayward et al. | 357/70 |
| 4,806,409 | 2/1989 | Walter et al. | 357/70 |
| 4,839,587 | 6/1989 | Flatley et al. | 324/158 F |

FOREIGN PATENT DOCUMENTS

| | | | |
|---|---|---|---|
| 232108 | 2/1987 | European Pat. Off. . | |
| 0046572 | 4/1980 | Japan | 357/80 |

OTHER PUBLICATIONS

IBM TDB, "Testable TAB Tape with Inner Guard Ring", vol. 31, No. 4, Sep./88, pp. 30–31.
The Automated Tape Carrier Bonding for Hybrids, Dr. Oswald et al., Solid State Technology, Mar. 1978, pp. 39–48.

Primary Examiner—Andrew J. James
Assistant Examiner—Viet Q. Nguyen
Attorney, Agent, or Firm—Jones, Tullar & Cooper

[57] ABSTRACT

A tape automated bonding tape segment carries on its top surface a printed circuit interconnect conductor high-density array having a plurality of signal, power and ground conductors. Burn-in testing pads are formed on either the top surface or the bottom surface of the tape segment, or both, and are connected to selected conductors. The testing pads are spaced apart and have a relatively low density to facilitate contact with test equipment, whereby a die connected to the printed circuit array can be tested.

17 Claims, 2 Drawing Sheets

BURN-IN PADS FOR TAB INTERCONNECTS

This application is a continuation of application Ser. No. 07/173,094, filed Mar. 28, 1988 now abandoned.

BACKGROUND OF THE INVENTION

The present invention relates, in general, to tape automated bonding (TAB) tape interconnect structures, and more particularly to a TAB interconnect construction which facilitates burn-in and permits the use of a simplified burn-in socket.

Tape automated bonding is a well known technique for fabricating packaged integrated circuit semiconductor devices. Semiconductor integrated circuits chips, or dies, conventionally have multiple electrical contact points which are connected through external electrical leads or thin film conductors to plug-in contacts, to printed circuit boards, or the like. In production processes in which tape automated bonding is employed, a strip of metallized tape in reel form carries a plurality of groups of metallic fingers or lines which form interconnect lines, or conductors. The conductors are arranged in arrays to be connected at inner ends to contact points on the integrated circuits, as by compression bonding, for example, with the outer ends of the conductors then forming external contacts of an integrated circuit package.

Patents directed to this technique illustrate conductor arrays formed from a very thin flexible metallized tape having a typical thickness of 2.3 to 2.9 mils. The conductor array utilizes interconnecting links between the adjacent conductors to hold them in the desired spaced relationship. In addition, sprocket hole perforations are provided along the outer edges of the tape for indexing and moving the tape through fabrication stations. After the contact points on the integrated circuit are bonded to the inner ends of corresponding metallic conductors, the circuit chip and the bonded connections are encapsulated. The interconnecting links between the conductors are then sheared to produce a semiconductor chip package having conductors by which it can be connected to suitable equipment for testing to make sure it is operating properly. Such a device is illustrated, for example, in U.S. Pat. No. 3,611,061.

Later patents illustrate a two-layer tape wherein the finger-like conductor lines are formed, as by etching techniques, in a metal foil carried on an insulative tape. These lines are formed from a thin copper foil with a thickness of from about 1.0 to 1.6 mils, with the insulating tape providing a support for the thin lines during the mounting of the integrated circuit chip and bonding of the chip contact points with the ends of the lines on the tape. The tape can remain as a part of the final assembly to provide support for the conductors. Such a tape is illustrated, for example, in U.S. Pat. No. 3,689,991.

The integrated circuit packages produced in the foregoing manner may then be used in a variety of circuit configurations, often becoming a part of highly expensive and complex circuits where high reliability is essential. However, the probability of having all of the semiconductor devices in such a complex circuit functioning within specifications is quite low, and accordingly it is extremely important that each semiconductor device be tested before such assembly.

One of the important tests to be conducted on an integrated circuit semiconductor die is the so-called burn-in test, in which bias supply voltages are applied to the device for a predetermined duration of time. Power is applied to the various bias voltage leads of the semiconductor chip, with power being applied for sufficient period of time to raise the temperature of the semiconductor device to a relatively high temperature, at least equal to that which it would be expected to encounter in use. This heating of the device with the applied bias voltages is intended to produce failures in any weak semiconductor devices, so that these can be weeded out and discarded, leaving only the satisfactory devices for assembly in circuits, or for delivery to customers.

Many complex integrated circuit semiconductor dies have very high lead counts, often in excess of 300 leads. Since the dies are quite small, the leads are extremely close together; for example, they might have an 8 mil pitch, with a spacing of 8 mils center to center. This high count and close spacing makes it very difficult to fabricate test sockets for connecting the leads to external equipment for test purposes. One standard method has been to fan out the interconnect lines carried by the TAB support tape to provide a relatively large pitch between adjacent conductors, and then to build a test socket that will connect to these leads. However, high lead count semiconductor devices still require a large number of contact points on the test socket, and the high count requires a larger tape to accommodate all of the leads when fanned out, thus requiring an extraordinarily expensive, complex test socket as well as significantly increased tape cost.

SUMMARY OF THE INVENTION

It is, therefore, an object of the present invention to provide a TAB interconnect tape structure which will accommodate burn-in testing, and which will thereby reduce the cost and complexity of burn-in test sockets.

Briefly, the present invention is directed to a TAB interconnect tape carrying arrays of photo-etched printed circuit interconnect conductors, including signal, power and ground lines. Those printed circuit conductors which are to be connected at their inner ends either to power leads or to ground leads on a die are connected at their outer ends on the TAB tape to large conductive test pads formed in the metallization of the printed circuit. In one form of the invention, these test pads are formed on the same side of the TAB tape as the remaining interconnect conductors, while in a second form of the invention, the test pads are formed in metallization on the opposite side of the TAB tape, from the conductor array. In this second embodiment, the metallized power and ground test pads are connected to corresponding power and ground conductors on the first side of the TAB tape through vias in the insulating support tape that separates the metal layers. In both embodiments, the large test pads permit the use of a very simple and relatively inexpensive socket for connecting suitable power sources and ground contacts through the interconnect conductors to the semiconductor device for burn-in. As noted above, a semiconductor chip may have more than 300 signal and power lines, but typically only about 40 leads need to be contacted for burn-in purposes. This reduced lead count, together with the large pad contact points, permits the use of a test socket that would cost approximately $50 to fabricate, whereas test sockets for contacting all 300 or more leads could cost $10,000 or more, if they could be obtained at all.

More particularly, the present invention is directed to a TAB tape segment carrying on its top surface a printed circuit interconnect conductor array having a plurality of signal, power and ground conductors. Each conductor has an inner end positioned on the TAB tape for connection to a corresponding contact on a die, with the inner ends being closely spaced in a high-density array surrounding a central area where the die is to be received. The conductors fan outwardly from the central area, and the ground and power conductors are connected at or near their outer ends to corresponding burn-in pads located near the periphery of the TAB tape segment. The burn-in pads are discrete conductive pads preferably formed as a part of the printed circuit conductor array. Since most of the contacts on the die are signal contacts, and only some of the die contacts are ground or power contacts, the number of burn-in pads is considerably less than the total number of conductors in the array. As a result, the burn-in pads have a relatively low density and can be large and widely spaced near the periphery of the TAB tape segment to facilitate connection of the interconnect conductors to a test socket, by which burn-in voltages can be applied to the power and ground conductors. If desired, the burn-in pads can have a constant pattern, even for different TAB conductor arrays, so that a single test socket can be provided for different dies.

The burn-in pads in one form of the invention are on the same surface of the TAB tape as the interconnect conductors, but in a preferred form they are on the opposite surface of the tape. In this latter embodiment, the conductor array is on a first surface of the tape, and may, for example, have the same conductor pattern as in the first embodiment, but in this case there would be no burn-in pads on the first surface. Instead, the burn-in pads are located on the opposite surface of the TAB tape, and are aligned with corresponding power conductors to which they are electrically connected by way of via holes through the TAB tape. In this embodiment, separate burn-in pads for the ground conductors may be used, but are not necessary, for the metal foil on the second surface remaining after the burn-in pads are etched can be used as a common ground plane. The ground plane is connected to the ground conductors on the first surface by way of vias formed through the TAB tape.

In the preferred form, the burn-in pads for the power conductors are formed as insulated islands in the foil layer on the bottom surface of the TAB tape, isolating the pads from the surrounding ground plane. The pads are located near the periphery of the TAB device so that they will have a relatively low density and a large contact area to facilitate use of a simple test socket.

BRIEF DESCRIPTION OF THE DRAWINGS

The foregoing and additional objects, features, and advantages of the present invention will become apparent to those of skill in the art from a consideration of the following detailed description thereof, taken in conjunction with the accompanying drawings, in which.

DESCRIPTION OF THE PREFERRED EMBODIMENTS

Figure 1:
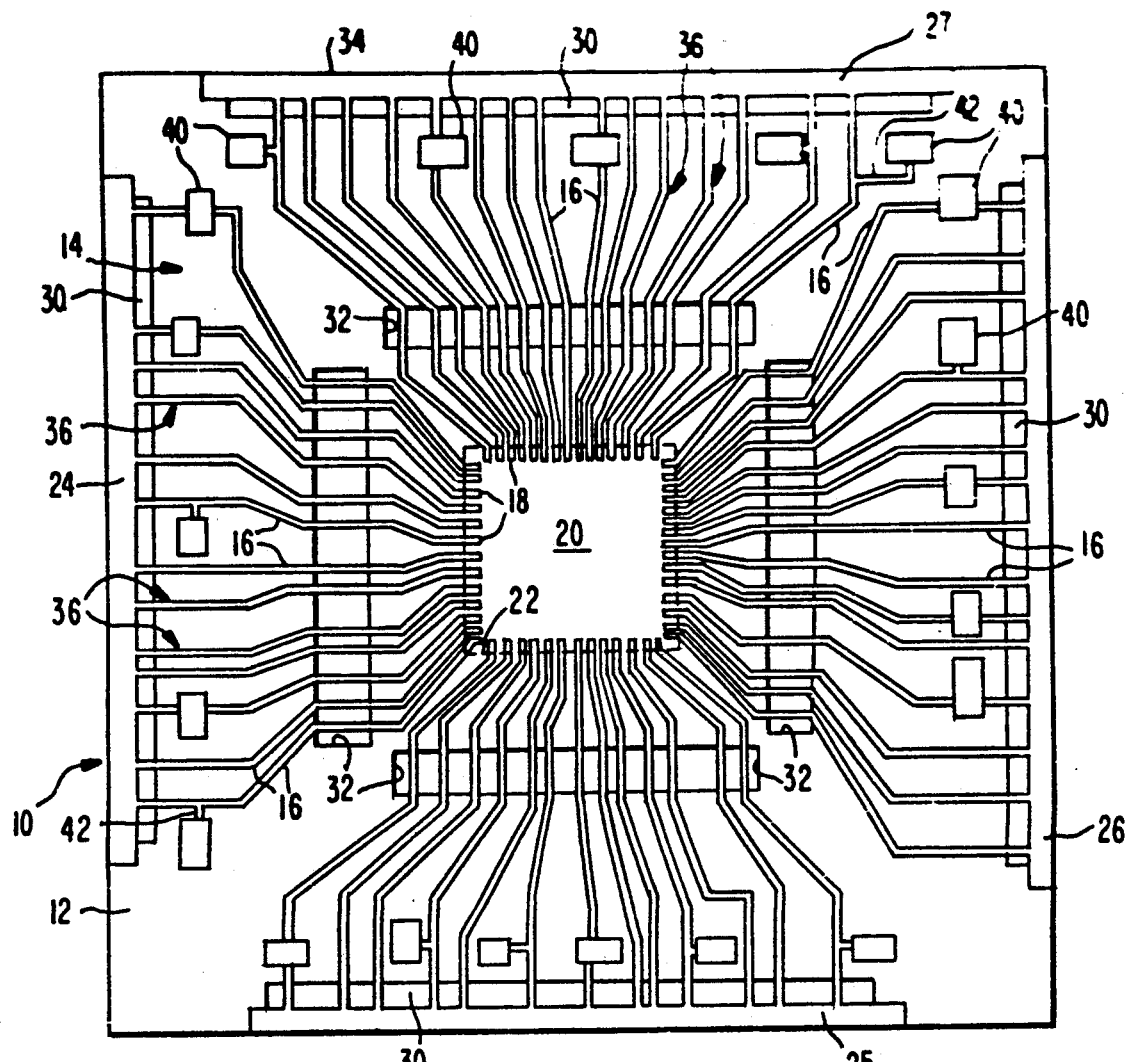
FIG. 1 is a top plan view of a TAB interconnect tape carrying a printed circuit constructed in accordance with a first embodiment of the present invention.

Turning now to a more detailed consideration of the present invention, there is illustrated in FIG. 1 a TAB interconnect tape segment 10 constructed from a thin insulating tape material 12 carrying a metal foil printed circuit conductor array generally illustrated at 14. The TAB tape is usually an elongated strip, typically supplied from a tape reel, and may have edge sprocket holes (not shown) for indexing, with the tape carrying repetitive patterns of conductor arrays in the conductive foil. The conductor arrays are normally fabricated in the metal foil layer of the tape by printing, masking and etching techniques, as is well known in the printed circuit art. Only a single printed circuit conductor array 14 is illustrated in the tape segment 10 of FIG. 1, but it will be understood that a TAB tape will typically carry a large number of such conductor arrays spaced along the length of the tape.

Each conductor array 14 typically includes a multiplicity of electrical conductors which provide electrical paths between power, ground and signal contacts on semiconductor chips, or dies (not shown) mounted on the tape and suitable external circuitry to which the semiconductor chip is to be connected. As illustrated, the array 14 includes a large number of individual interconnect conductors 16 mounted on the insulating tape 12 and forming a fanned-out pattern to provide sufficient space between adjacent conductors to facilitate connection of the power, ground and signal leads on the semiconductor chip to an external circuit for permanent mounting or for test purposes. The inmost ends 18 of the conductors 16 terminate at the center of the array in a pattern which exactly matches the pattern of contact points on a semiconductor chip to be mounted on the TAB tape, and thus define a chip receiving area 20 at the center of the array.

To mount a semiconductor die on the TAB tape, the die is positioned in the center of array 14 over the central area 20 with its contacts in alignment with the inmost ends 18 of the printed circuit array 14. The contact points on the die are then bonded to the corresponding inner ends 18, for example, by pressure bonding. Conventionally, after bonding, the attached semiconductor chip, the bonds, and the inner ends of the interconnect conductors 16 are encapsulated to form a molded plastic package in the region illustrated by the dotted lines 22. After such encapsulation, a suitable carrier frame (not shown) may be mounted on the carrier tape 12 and the tape segment 10 trimmed from the continuous strip to provide a chip package carrier, as is known in the art.

It is usual in the art to interconnect the outermost ends of adjacent conductors by means of integral cross links extending transversely across the conductors, such as the four cross links, 24, 25, 26 and 27 illustrated in FIG. 1. These cross links are formed on the supporting substrate, or tape 12, and are used as contacts for electroplating the conductor 16 after they have been formed on the tape segment. Excise apertures such as apertures 30 and 32 are formed through the film 12, the apertures 30 permitting separation of the conductors after electroplating, and the apertures 32 permitting separation of the conductors from the burn-in pads after the burn-in testing is complete.

The array 14 illustrated in FIG. 1 is simplified to facilitate illustration of the invention, and thus includes only a small proportion of the interconnect conductors usually required for a complex semiconductor integrated circuit. Such circuits may have in excess of 300 connection points formed in the general pattern illustrated at area 20 in FIG. 1, to be connected to the inner ends 18 of the conductors 16. The interconnect conductors 16 are fanned outwardly toward the peripheral edge 34 of the segment 10, and may have a pitch, or center to center distance, of about 8 mils at the outer ends portions 36. A test socket for connection to all of these closely-spaced outer ends requires a large number of extremely closely-spaced contacts. Fabrication of such a test socket would be very expensive and time-consuming, since it would be a special-purpose tool that would have to be made to match a particular conductor array. Accordingly, burn-in testing of semiconductor chips even after they are mounted on the tape segment 10 and connected to the conductor array 14, remained difficult and expensive in the prior art.

In accordance with the present invention, burn-in testing is facilitated by the provision of a series of discrete, spaced, burn-in test pads 40, located around the peripheral edge 34 of the tape segment 10. These test pads are formed at the same time as the array 14, using the same printed circuit techniques of printing, masking and etching, with the pads being connected directly, or indirectly by way of conductor extensions 42, to the outer end portions 36 of selected interconnect conductors 16. The selected conductors 16 lead, in turn, to corresponding ground or power supply contact points on the semiconductor chip mounted on the TAB tape. Thus, selected burn-in test pads 40 serve as ground points for the semiconductor chip, while other pads serve as power supply points for the chip. As many pads are provided as are required for making the necessary connections to the various ground and power supply points on the chip, and it has been found that for a chip having in excess of 300 interconnect conductors, only about 40 burn-in pads are required to make the necessary burn-in connections. Accordingly, the design of a socket for providing the required burn-in voltages to the semiconductor chip is greatly simplified, for the socket contacts can be relatively large and widely spaced, with only about 40 contacts being needed. This allows high lead count TAB devices to be burned in with a low cost, simple and readily available socket. For convenience of design, it is preferred that the burn-in pads 40 be evenly spaced about the peripheral edge of the segment 10. If desired, a standard pattern for the pads 40 may be provided so that a standardized burn-in socket can be utilized. In such a case, the individual pads would be located in known positions, and the interconnections by way of conductor extensions 42 would then be included as a part of the design of the printed circuit array 14 to provide the desired connections.

It will be understood that during the burn-in process, when the burn-in socket is connected to pads 40, the remaining conductors 16, which form the signal lines for the integrated circuit, remain unconnected, since a static burn-in process does not require that signals be applied to these lines. After completion of the burn-in, integrated circuit chips that fail are discarded, while the remaining chips are processed in the usual way for connection into circuits and further testing as required.

Figure 2:
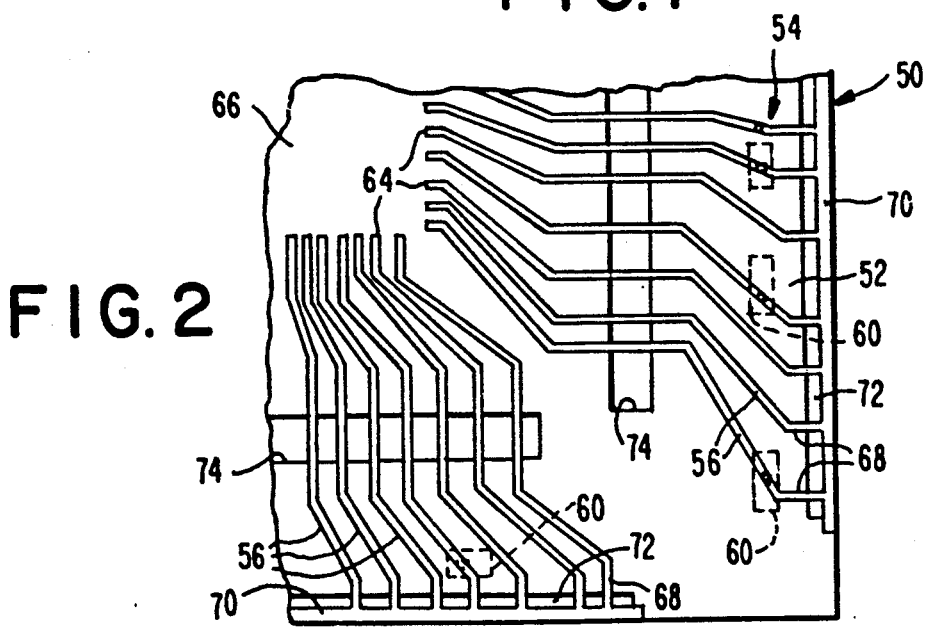
FIG. 2 is a partial top plan view of a second embodiment of the TAB interconnect tape of the present invention.
Figure 3:
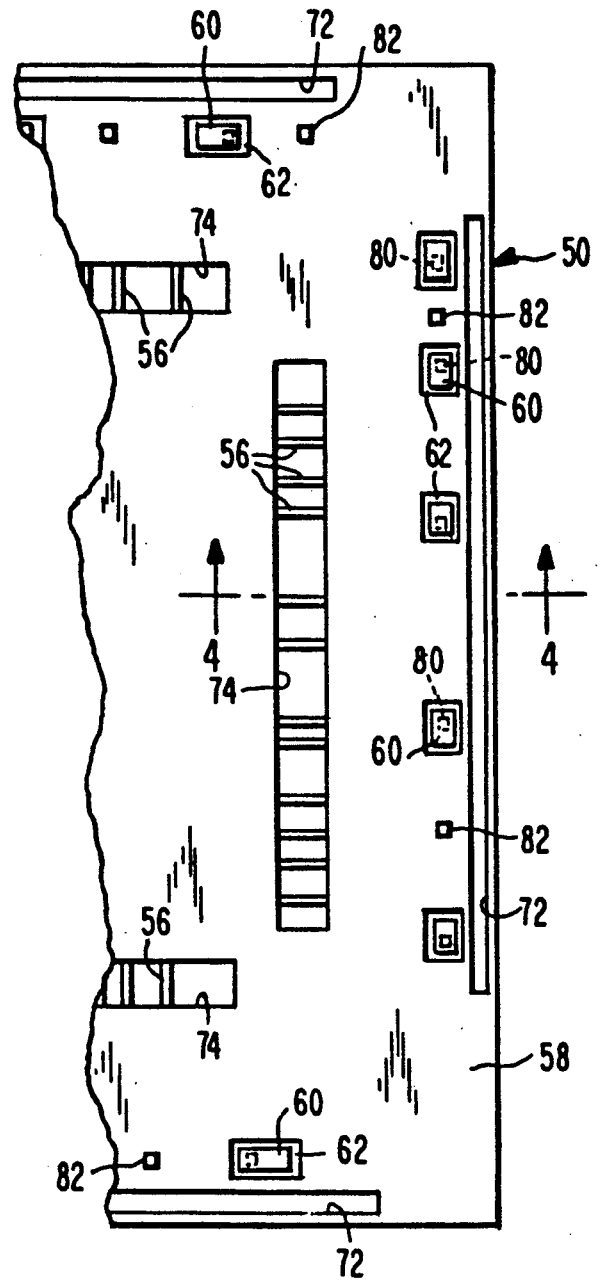
FIG. 3 is a partial bottom plan view of the TAB interconnect tape of FIG. 2.
Figure 4:
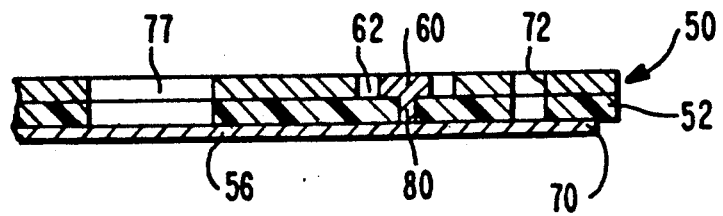
FIG. 4 is a cross-sectional view of the device of FIG. 3, taken along lines 4—4.

In the embodiment of FIG. 1, the entire printed circuit array and the burn-in pads are formed on a single surface of the TAB tape. An alternative configuration is illustrated in FIGS. 2, 3 and 4, where the conductor array is on one surface of the tape 12, as before, but the burn-in test pads are formed on the opposite surface of the tape. The assembly of FIG. 1 has the advantage of only requiring metal foil on one side of the support tape 12, whereas the configuration of FIGS. 2 to 4 requires metallization on both surfaces of the tape.

In the modified version of the TAB burn-in pad structure of the present invention, illustrated in FIG. 2, the conductor array and the burn-in pads are formed on a TAB segment 50. The TAB segment in this embodiment includes a tape 52, which is an insulating film or layer 52 that is metallized on both the top and bottom surfaces. A thin metal foil on the top surface is patterned and etched in a conventional way to form a printed circuit conductor array 54 having a multiplicity of interconnect conductors 56, corresponding to the array 14 and conductors 16 described with respect to FIG. 1. Similarly, a thin metal foil 58 on the bottom surface of the tape (FIG. 3) is patterned and etched in conventional manner to provide a plurality of discrete, spaced burn-in pads 60. The entire foil layer 58 except for pads 0 may be etched away, if desired, but preferably layer 58 is retained, with the pad areas being defined by etched-away regions 62 surrounding each pad, isolating the pads from the rest of the layer 58 so that the foil surrounding the pads will serve as a metallic ground plane.

As discussed with respect to FIG. 1, the conductors 56 in array 54 have inner ends 64 which are located adjacent a chip-receiving area 66 located generally at the center of the printed circuit array. The inner ends 64 are spaced and located for alignment with corresponding contact points on the integrated circuit chip to be mounted on segment 50. The conductors 56 fan outwardly from their contact points with the chip so that the outermost end portions 68 are more widely spaced than the innermost ends 64 to facilitate connection of the conductors to exterior circuits or to test equipment. For clarity, only a few of the conductors are illustrated, it being understood that the array 54 may include in excess of 300 conductors connected to corresponding contacts on a semiconductor integrated circuit chip, with the pitch of the conductors being, for example, about 8 mils at the outer ends.

In the illustrated embodiment of FIGS. 2, 3 and 4, the film or tape 52 is an insulating material such as Kapton, while the metal foil preferably is copper. Because the leads 56 are copper foil with a protective surface metallization, it is conventional to provide plating busses or conductive cross-link 70 extending between the outermost ends of conductors 56 to allow electroplating of the protective surface metallization. To facilitate removal of the plating busses 70, excise apertures 72 are provided. Additional excise apertures 74 are provided to permit severing of the conductors leading to the burn-in pads 60. If desired, conductor support bars (not shown) formed from the insulating film may be provided to stabilize the conductors in the excise apertures 72. Preferably such stabilizing bars are adhered to the bottom surfaces of the conductors 56.

At any desired location on the undersurface 58 of the insulating tape 52 (see FIG. 3), and preferably between the excise apertures 72 and the plating busses 70, a plurality of the TAB burn-in test pads 60 are formed from the metal foil layer 58. The pads 60 are formed by conventional printing, masking and etching techniques, as discussed above, to isolate the pads from the surrounding metal layer 58 when that layer is retained as a ground plane, with the result that each pad is surrounded by an individual etched-away region which forms peripheral insulating channel such as those illustrated at 62 in FIGS. 3 and 4. The channels are etched through the metal layer 58 to expose the underlying insulating tape. The pads 60 are thus electrically insulated from the metal layer 58 and from each other so that they can be used as contacts for the burn-in process.

The burn-in test pads 60 are connected to selected power or ground conductors 56 on the opposite side of the insulating tape 52 by way of connector leads which pass through vias, or through openings, such as those illustrated at 80 and 82. The vias are formed through the insulating layer 52 of Kapton, again by conventional masking and etching techniques, and are located to intersect selected conductors 56. The vias preferably are formed prior to the metallization of apton tape, so that when the foil layers are plated on the tape, the metal will flow through the vias to provide through conductors to provide electrical connections between the top and bottom metal layers on the tape 52. Thereafter, when the metal layers are patterned and etched to form the conductors 56 on the top surface (FIG. 2) and the burn-in pads 60 on the bottom surface (FIG. 3) the through conductors in the vias 80 remain, to connect selected conductors 56 to corresponding burn-in pads 60. Since the selected conductors are arranged to contact respective ground or bias power contact points of a die mounted on the TAB tape, as was the case with the device of FIG. 1, the burn-in pads 60 can be used to connect a test socket to the die.

In the preferred form of the invention, pads 60 are provided for the bias power conductors of array 54, while the layer 58 provides a ground plane which surrounds the individual pads. In this configuration, through conductors provided by the metallization of vias 82 remain after the etching of the conductors 56 and the pads 60, and serve to provide connections between selected ground conductors 56 and the metal film 58. The ground plane film 58 for the TAB device is thus connected to the ground points on the die by way of selected conductors 56. Accordingly, bias power voltages may be applied to the die by way of pads 60 and ground plane 58 to burn-in the die connected to array 54.

The burn-in pads 60 are preferably located in a regular pattern near the peripheral edge of the tape segment 50 to facilitate contact with a burn-in socket. The burn-in takes place after removal of the cross-links 70 so that the signal-carrying conductors, which are not connected to the burn-in pads, will not receive the power supply voltages.

It will be understood that for clarity of illustration the interconnect conductors carried on the top surface of the segment 50 are not shown in the bottom view of FIG. 3 where they cross the excise apertures 72. However, the conductors 56 would normally be visible through these apertures, as shown with respect to excise apertures 74.

Although the present invention has been described in terms of burn-in testing of dies, it will be understood that the burn-in pads can be used for other tests, as well, and that variations and modifications of the described embodiments may be made without departing from the true spirit and scope thereof, as set forth in the accompanying claims.

What is claimed is:

1. A semiconductor device TAB interconnect tape having an upper surface and a lower surface, and carrying a printed circuit interconnect conductor array, comprising:

a tape having an upper surface, a lower surface, and a central aperture;

a multiplicity of signal, power and ground interconnect conductors on said tape upper surface, each conductor having a first, inner end and a second, outer end portion, said multiplicity of conductors including at least 300 conductors, with the inner ends thereof being positioned in a high-density, side-by-side array and arranged for connection to corresponding signal, power and ground contacts positioned in a high-density arrangement on a semiconductor integrated circuit device, said signal, power and ground interconnect conductors of said array being fanned outwardly from said central aperture on said upper surface to position said conductor outer end portions at a relatively lower density;

a plurality of spaced, discrete burn-in pads on at least one of said upper and lower tape surfaces adjacent the periphery of said array, the number of said burn-in pads being no more than the number of power and ground interconnect conductors in said array; and means connecting said burn-in pads to the outer end portions of only corresponding power or ground conductors of said array whereby burn-in voltages can be applied to said power and ground interconnect conductors and thereby to corresponding power and ground contacts of a semiconductor device connected to said inner ends of said interconnect conductors.

2. The TAB tape array of claim 1, wherein said burn-in pads are arranged in a predetermined pattern on said upper surface of said TAB tape to facilitate connection to a source of burn-in voltages.

3. The TAB tape array of claim 1, wherein said burn-in pads are located on said lower surface below and aligned with selected power and ground conductors on said upper surface.

4. The TAB tape array of claim 1, wherein said means connecting said burn-in pads to the outer end portions of corresponding power or ground conductors includes leads extending through via holes in said tape to interconnect a power or ground conductor on said upper tape surface with a corresponding burn-in pad on said lower tape surface.

5. The TAB tape array of claim 4, wherein all of said burn-in pads are located on said lower tape surface and are arranged in a predetermined pattern to facilitate connection to a source of burn-in voltages.

6. The TAB tape array of claim 5, wherein said burn-in pads are located on said lower tape surface below and in alignment with corresponding power conductors on said upper tape surface.

7. The TAB tape array of claim 6, further including an electrically conductive ground plans on said lower tape surface, said ground plane being electrically isolated from said burn-in pads connected to said power conductors and being connected to said ground conductors by corresponding connector leads.

8. The TAB tape of claim 7, wherein said ground plane surrounds said burn-in pads and is electrically isolated therefrom by peripheral channels surrounding said burn-in pads.

9. The TAB tape array of claim 1 where at least some of said burn-in pads are located on said lower tape surface.

10. The TAB tape of claim 1, wherein said means connecting said burn-in pads to the outer end portions of corresponding power or ground conductors includes conductor extension leads.

11. The TAB tape of claim 1 w herein said burn-in pads are located on said upper tape surface and are spaced apart to provide a relatively low density pattern around said array.

12. The TAB tape of claim 1, w herein the number of burn-in pads is approximately about 40.

13. A semiconductor device TAB interconnect tape having an upper surface nad a lower surface, and carrying a printed circuit interconnect conductor array, comprising:
    a tape having an upper surface, a lower surface, and a central aperture;
    a multiplicity of signal power and ground interconnect conductors arrayed on said upper surface of said tape each conductor having an inner end and an outer end portion, said multiplicity of conductors including at least 300 conductors, with the inner ends thereof positioned in a high-density, side-by-side arrangement around said central aperture at locations corresponding to signal, power and ground contacts positioned in a high-density arrangement on a semiconductor integrated circuit device located in said central aperture, said inner ends of said signal, power and ground interconnect conductors on said tape being arranged for connection to corresponding contacts on a semiconductor device, said multiplicity of conductors being fanned outwardly from said central aperture on said tape upper surface to position said conductor outer end positions away from said central aperture and at a relatively lower density than said inner ends;
    a plurality of spaced, discrete burn-in pads on at least one of said upper and lower surfaces of said tape, said burn-in pads being adjacent the periphery of said array, the number of said burn-in pads being no greater than the total number of power and ground interconnect conductors on said upper surface arranged for connection to corresponding power and ground contacts on a semiconductor device; and
    means connecting said burn-in pads to the outer end portions of only corresponding power or ground conductors of said multiplicity of conductors, whereby burn-in voltages can be applied to said power and ground interconnect conductors and thereby to corresponding power and ground contacts of a semiconductor device connected to said inner ends of said interconnect conductors.

14. The semiconductor device TAB interconnect tape of claim 13, wherein at least some of said burn-in pads are located on said lower surface of said tape, and further including ground plane means on said tape lower surface surrounding but not contacting said burn-in pads.

15. The semiconductor device TAB of claim 14, further including means electrically isolating said burn-in pads from said ground plane.

16. The semiconductor device TAB of claim 15, wherein said burn-in pads are located on said lower tape surface and in alignment with corresponding power conductors on said upper tape surface.

17. The semiconductor device TAB of claim 15, wherein the number of burn-in pads is approximately 40.

* * * * *

UNITED STATES PATENT AND TRADEMARK OFFICE
CERTIFICATE OF CORRECTION

PATENT NO.   : 5,036,380
DATED        : July 30, 1991
INVENTOR(S)  : RICHARD A. CHASE It is certified that error appears in the above-identified patent and that said Letters Patent is hereby corrected as shown below:

Column 8, line 43:
   Claim 4 of the printed patent (original file claim 6) should have been dependent on printed patent claim 9 (original file claim 22).

Claim 7, column 8, line 58, "plans" should be --plane--.

Claim 11, column 9, line 8, "w herein" should be --wherein--.

Claim 12, column 9, line 12, "w herein" should be --wherein--.

Claim 13, column 9, line 15, "nad" should be --and--.

Signed and Sealed this

Eighth Day of December, 1992

Attest:

DOUGLAS B. COMER

*Attesting Officer*           *Acting Commissioner of Patents and Trademarks*